(12) United States Patent
Ohsaki et al.

(10) Patent No.: US 7,688,424 B2
(45) Date of Patent: Mar. 30, 2010

(54) MEASUREMENT APPARATUS, EXPOSURE APPARATUS, AND DEVICE FABRICATION METHOD

(75) Inventors: Yumiko Ohsaki, Utsunomiya (JP); Seiji Takeuchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/205,288

(22) Filed: Sep. 5, 2008

(65) Prior Publication Data
US 2009/0066925 A1   Mar. 12, 2009

(30) Foreign Application Priority Data
Sep. 11, 2007   (JP) .............................. 2007-235947

(51) Int. Cl.
G03B 27/72 (2006.01)
G03B 27/54 (2006.01)
(52) U.S. Cl. .......................................... 355/71; 355/67
(58) Field of Classification Search .................. 355/52, 355/53, 55, 67–71; 356/364, 399–401, 491, 356/521; 250/548
See application file for complete search history.

(56) References Cited

U.S. PATENT DOCUMENTS

| 7,084,977 | B2 | 8/2006 | Nomura |
| 7,106,452 | B2 | 9/2006 | Ouchi |
| 7,283,207 | B2 * | 10/2007 | Nomura ....................... 355/67 |
| 7,286,245 | B2 * | 10/2007 | Wegmann et al. ........... 356/521 |
| 7,289,223 | B2 | 10/2007 | Mengel |
| 7,375,799 | B2 | 5/2008 | Van De Kerkhof et al. |
| 7,466,395 | B2 * | 12/2008 | Ohsaki et al. ................. 355/67 |
| 2006/0187435 | A1 * | 8/2006 | Ohsaki ......................... 355/55 |
| 2006/0203221 | A1 | 9/2006 | Van De Kerkhof et al. |
| 2008/0037905 | A1 | 2/2008 | Wegmann et al. |

FOREIGN PATENT DOCUMENTS

| JP | 02-116732 A | 5/1990 |
| JP | 2002-071515 A | 3/2002 |
| JP | 2004-061515 A | 2/2004 |
| JP | 2004-257854 A | 9/2004 |
| JP | 2005-116732 A | 4/2005 |
| JP | 2006-237617 A | 9/2006 |
| WO | WO 03/028073 A1 | 4/2003 |

* cited by examiner

*Primary Examiner*—Hung Henry Nguyen
(74) *Attorney, Agent, or Firm*—Canon U.S.A. Inc., I.P. Division

(57) ABSTRACT

The present invention provides a measurement apparatus including a first polarization control unit configured to control a polarization state of light which enters an optical system to be measured to at least two different polarization states, a wavefront splitting unit which is inserted between the first polarization control unit and the optical system, a second polarization control unit which is inserted between the optical system and an image sensor, includes a phase plate, and is configured to control the polarization state of the light, and a processing unit configured to calculate the optical characteristics of the optical system, based on a plurality of interference patterns sequentially sensed by the image sensor by rotating the phase plate.

11 Claims, 10 Drawing Sheets

FIG. 3

| | STRUCTURE OF MEASUREMENT RETICLE | STRUCTURE OF WAVEFRONT SPLITTING UNIT |
|---|---|---|
| (a) | PINHOLE | TWO-DIMENSIONAL DIFFRACTION GRATING (CROSS DIFFRACTION GRATING) |
| (b) | PINHOLE | ONE-DIMENSIONAL DIFFRACTION GRATING |
| (c) | SLIT | ONE-DIMENSIONAL DIFFRACTION GRATING |
| (d) | PINHOLE | SEMITRANSPARENT REFLECTING SUBSTRATE |

MEASUREMENT APPARATUS, EXPOSURE APPARATUS, AND DEVICE FABRICATION METHOD

BACKGROUND OF THE INVENTION

1. Field of the Invention

The present invention relates to a measurement apparatus, an exposure apparatus, and a device fabrication method.

2. Description of the Related Art

An exposure apparatus has conventionally been employed to fabricate micropatterned semiconductor devices such as a semiconductor memory and logic circuit by using photolithography. The exposure apparatus projects and transfers a circuit pattern formed on a reticle (mask) onto a substrate such as a wafer by a projection optical system.

A minimum line width (resolution) that the exposure apparatus can transfer is proportional to the exposure light wavelength and is inversely proportional to the numerical aperture (NA) of the projection optical system. Along with the recent demand for increasing the packing density and the degree of integration of semiconductor devices, the exposure apparatus is required to attain a higher resolution. To meet this demand, the exposure light wavelength is shortening, and the NA of the projection optical system is increasing. For example, to shorten the exposure light wavelength, a KrF excimer laser (with a wavelength of about 248 nm) or an ArF excimer laser (with a wavelength of about 193 nm) has come to be used as the exposure light source in place of a superhigh pressure mercury lamp. To increase the NA of the projection optical system, an immersion exposure technique is attracting a great deal of attention. This technique increases the NA of the projection optical system by filling the space between the projection optical system and the wafer with a liquid, which has a refractive index higher than 1, such as pure water.

As the resolution of the exposure apparatus increases, a stricter demand has arisen for the measurement, adjustment, and correction of the optical characteristic of the projection optical system. For example, it is demanded to precisely measure even a change in optical characteristic due to heat generated during exposure and that due to a slight change in lens position, which occurs in the process of transporting the exposure apparatus. The optical characteristic of the projection optical system must be measured by the exposure apparatus while the projection optical system is mounted in the exposure apparatus, and be adjusted to an optimal state. Note that the optical characteristic herein does not depend on the polarization of the exposure light, and represents the phase difference from an ideal state, as in the conventional wavefront aberration. This optical characteristic will be referred to as "non-polarization aberration" hereinafter).

The polarization state of the exposure light is becoming an important factor along with an increase in the NA of the projection optical system, so the polarization of the exposure light must be controlled. However, even when the polarization state of the exposure light is controlled to a desired one by the illumination optical system, the polarization state of the exposure light in the projection optical system often changes due to, for example, the holding of a lens, the deformation of a lens due to heat, the use of a birefringent glass material, or the reflection of the exposure light by a mirror. Naturally, the necessity of precisely knowing the polarization state of the exposure light in the projection optical system is growing. The optical characteristic of the projection optical system attributed to its birefringence depends on the polarization of the exposure light, and will be referred to as "polarization aberration" hereinafter. The polarization aberration includes the retardation and azimuth (along the fast axis and slow axis) of birefringence. However, there are various known polarization aberration expression methods such as the Stokes parameters, Jones matrix, and Mueller matrix, in addition to the retardation and azimuth.

In this manner, the recent exposure apparatus must measure the non-polarization aberration, which does not depend on the polarization of the exposure light, and the polarization aberration, which depends on the polarization of the exposure light, of the projection optical system as its optical characteristics with high accuracy in a short period of time. Under the circumstance, several techniques of measuring the non-polarization aberration and polarization aberration of an optical system have been proposed.

For example, Japanese Patent Laid-Open Nos. 2-116732, 2002-71515, and 2004-257854 disclose techniques using an interferometer dedicated to measurement, which utilizes interference between the reference wavefront and the wavefront to be measured. PCT(WO) 2003/028073 discloses a technique using an aberration measurement unit which measures the non-polarization aberration, and a polarization conversion unit which roughly calculates the polarization aberration. Japanese Patent Laid-Open No. 2005-116732 discloses a technique of calculating the Mueller matrix as the polarization aberration of the projection optical system. Japanese Patent Laid-Open Nos. 2004-61515 and 2006-237617 disclose techniques of measuring the polarization aberration of the projection optical system using an interferometer.

Unfortunately, these prior arts cannot simultaneously measure the non-polarization aberration and the polarization aberration (the retardation and azimuth of birefringence), while the projection optical system is mounted in the exposure apparatus, with high accuracy in a short period of time. Particularly in recent years, since the exposure light readily heats up an optical system so that the non-polarization aberration and polarization aberration change with time, the non-polarization aberration and polarization aberration must be measured in a shorter period of time in response to these changes. Also, the required accuracy of measuring the non-polarization aberration and polarization aberration is becoming stricter along with advance of the micropatterning of semiconductor devices.

For example, since the interferometers dedicated to measurement, which are disclosed in Japanese Patent Laid-Open Nos. 2-116732, 2002-71515, and 2004-257854, each use a relatively long, complicated optical path that does not serve as a common path, the influences of vibration on them are non-negligible. Still worse, it is difficult to apply such an interferometer to measurement on the exposure apparatus because the exposure light has a very short coherence length.

PCT(WO) 2003/028073 proposes a technique of measuring the optical characteristics of an optical system by two orthogonal linearly polarized light beams using an aberration measurement unit and polarization conversion unit. However, the use of only the two orthogonal linearly polarized light beams is insufficient to precisely measure the polarization aberration of the projection optical system. Note also that the aberration measurement unit and polarization conversion unit each include a CCD as an image sensing element, and the CCD is inserted/removed into/from the exposure apparatus. This may make it impossible to measure the optical characteristics with high accuracy as the positional relationship between the optical axis and the CCD in the exposure apparatus varies. Also, since the aberration measurement unit and polarization conversion unit must be aligned before the measurement, a correspondence between the non-polarization aberration and the polarization aberration may shift depending on the alignment accuracy. These two units include optical system. When attaching and detaching these whole units including the optical system, very high alignment accuracy with the optical axis of the optical system is required. Since PCT(WO) 2003/028073 requires two units, that is, the aberration measurement unit and polarization conversion unit, the cost increases.

Japanese Patent Laid-Open No. 2005-116732 discloses an application of a general technique of inserting a phase shifter, polarizer, and light-receiving element in turn at the succeeding stage of an optical system to be measured, and rotating the phase shifter to detect a change in intensity, thereby detecting the polarization state of the optical system to be measured. Japanese Patent Laid-Open No. 2005-116732 can precisely calculate the Mueller matrix as the polarization aberration, but does not disclose a technique of measuring the non-polarization aberration.

Japanese Patent Laid-Open Nos. 2004-61515 and 2006-237617 disclose techniques of measuring the polarization aberration of the projection optical system using an interferometer, as described above. These techniques exploit, in particular, shearing interference. Japanese Patent Laid-Open Nos. 2004-61515 and 2006-237617 disclose techniques of measuring the polarization aberration, but do not disclose the measurement conditions and techniques of measuring the non-polarization aberration. When a polarizer is inserted at the preceding stage of a photodetector, the light amount greatly changes depending on the relationship between the polarization state of the incident light beam and the rotation angle of the polarizer. For example, assuming that the incident light beam is linearly polarized, the light amount becomes a maximum if the polarization direction matches the transmission axis of the polarizer, while it becomes a minimum if the polarization direction is perpendicular to the transmission axis of the polarizer. The light amount becomes particularly small when the birefringence amount is small. Because the measurement accuracy and the light amount have a close relationship, the optical characteristics cannot be measured unless an optimal set of measurement conditions can be ensured.

Neither of the techniques disclosed in Japanese Patent Laid-Open Nos. 2004-61515 and 2006-237617 provides a system in which the exposure apparatus can measure the reference polarization aberration which serves as a reference in measuring the polarization aberration. These techniques cannot cope with a temporal change in reference polarization aberration and therefore cannot measure the polarization aberration of the projection optical system with high accuracy. Even when the reference polarization aberration is measured in advance by another measurement system, it is different from that on the exposure apparatus due to the influence of, for example, a thermal change of a lens by the exposure light or the deformation of a lens in the process of mounting the projection optical system into the exposure apparatus.

SUMMARY OF THE INVENTION

The present invention provides a measurement apparatus which can measure both the non-polarization aberration and the polarization aberration (the retardation and azimuth of birefringence) of a projection optical system as its optical characteristics, while the projection optical system is mounted in an exposure apparatus, with high accuracy in a short period of time.

According to one aspect of the present invention, there is provided a measurement apparatus which measures optical characteristics of an optical system to be measured, comprising a first polarization control unit configured to control a polarization state of light which enters the optical system to be measured to at least two different polarization states, an image sensor configured to measure light transmitted through the optical system to be measured, a wavefront splitting unit which is inserted between the first polarization control unit and the optical system to be measured or between the optical system to be measured and the image sensor, and is configured to split a wavefront of the light, a second polarization control unit which is inserted between the optical system to be measured and the image sensor, includes a phase plate which be rotatable about an optical axis, and is configured to control the polarization state of the light, and a processing unit configured to calculate the optical characteristics of the optical system to be measured, based on a plurality of interference patterns sequentially sensed by the image sensor by rotating the phase plate.

According to another aspect of the present invention, there is provided an exposure apparatus comprising an illumination optical system configured to illuminate a reticle with light from a light source, a projection optical system configured to project a pattern of the reticle onto a substrate, and a measurement apparatus configured to measure optical characteristics of at least one of the projection optical system and the illumination optical system as an optical system to be measured, wherein the measurement apparatus includes the above measurement apparatus.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

BRIEF DESCRIPTION OF THE DRAWINGS

FIG. 3 is a table for explaining combinations of the patterns of a measurement reticle and wavefront splitting unit in a measurement apparatus of the exposure apparatus shown in FIG. 1.

DESCRIPTION OF THE EMBODIMENTS

Figure 1:
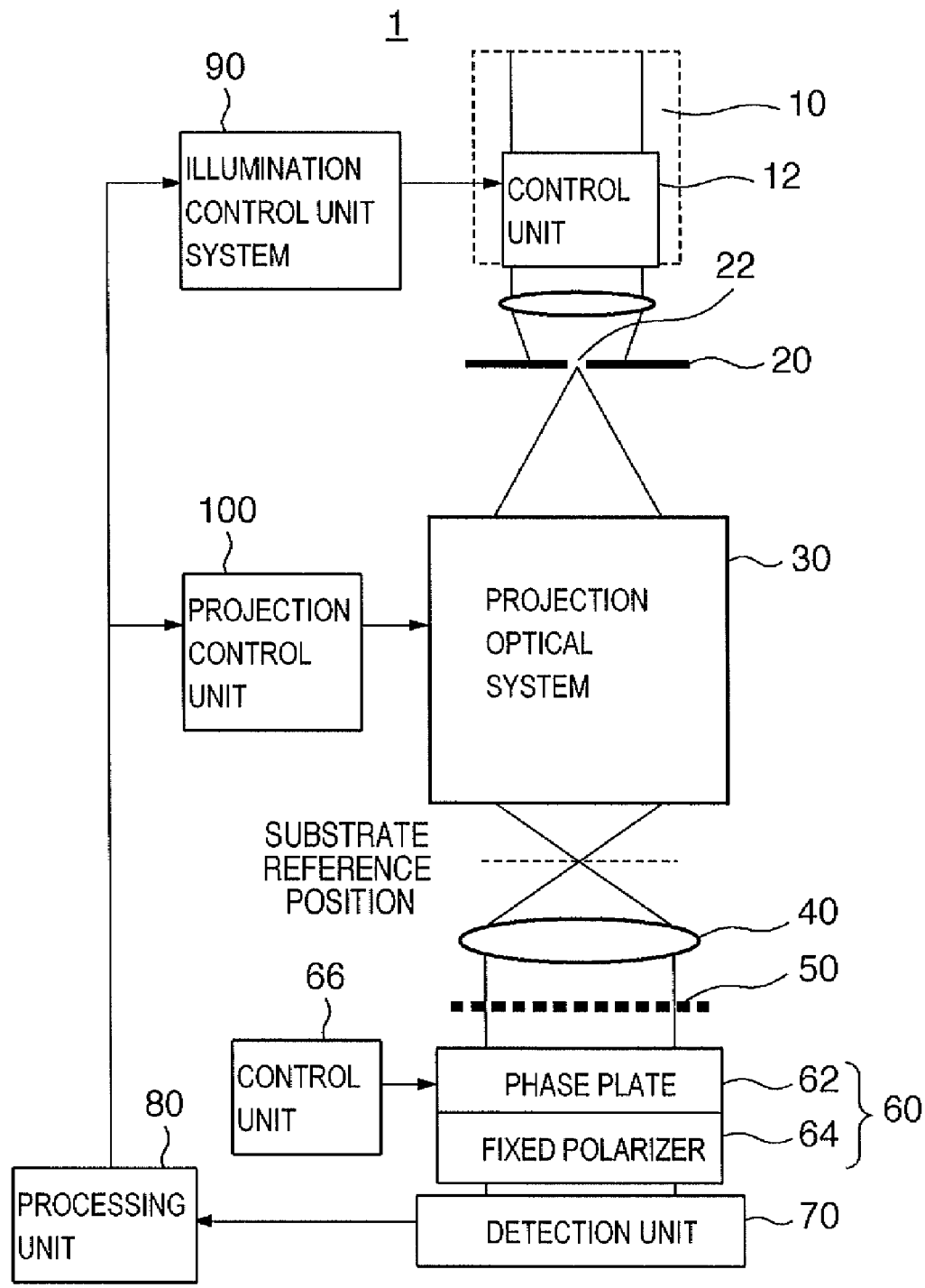
FIG. 1 is a schematic block diagram showing an exposure apparatus according to a first embodiment of the present invention.

Preferred embodiments of the present invention will be described below with reference to the accompanying drawings. The same reference numerals denote the same members throughout the drawings, and a repetitive description thereof will not be given.

First Embodiment

FIG. 1 is a schematic block diagram showing the arrangement of an exposure apparatus 1 according to the first embodiment of the present invention. An example of the exposure apparatus 1 is a projection exposure apparatus which transfers the pattern of a reticle onto a wafer (substrate) by exposure using the step & scan scheme. However, the exposure apparatus 1 can adopt the step & repeat scheme or another exposure scheme.

The exposure apparatus 1 illuminates a reticle with light from a light source and projects (transfers) by exposure the pattern of a reticle onto a wafer, which is set at a substrate reference position, while scanning them. The substrate reference position herein is the focus position of a projection optical system 30 (i.e., the image plane of the projection optical system 30). The exposure apparatus 1 includes an illumination apparatus including a light source and an illumination optical system 10 for illuminating the reticle with light from the light source, a reticle stage for supporting and driving the reticle, the projection optical system 30, and a wafer stage for supporting and driving the wafer. The exposure apparatus 1 also includes an illumination system control unit 90 for adjusting the illumination optical system 10, and a projection system control unit 100 for adjusting the projection optical system 30. The projection optical system 30 may be a dioptric system or catadioptric system.

The exposure apparatus 1 includes a measurement apparatus for measuring the optical characteristics of the projection optical system 30 as the optical system to be measured. In the first embodiment, the measurement apparatus constitutes a shearing interferometer, and includes the illumination optical system 10 including a first polarization control unit 12, a measurement reticle 20, a collimator lens 40, a wavefront splitting unit 50, a second polarization control unit 60, a detection unit 70, and a processing unit 80.

Figure 2:
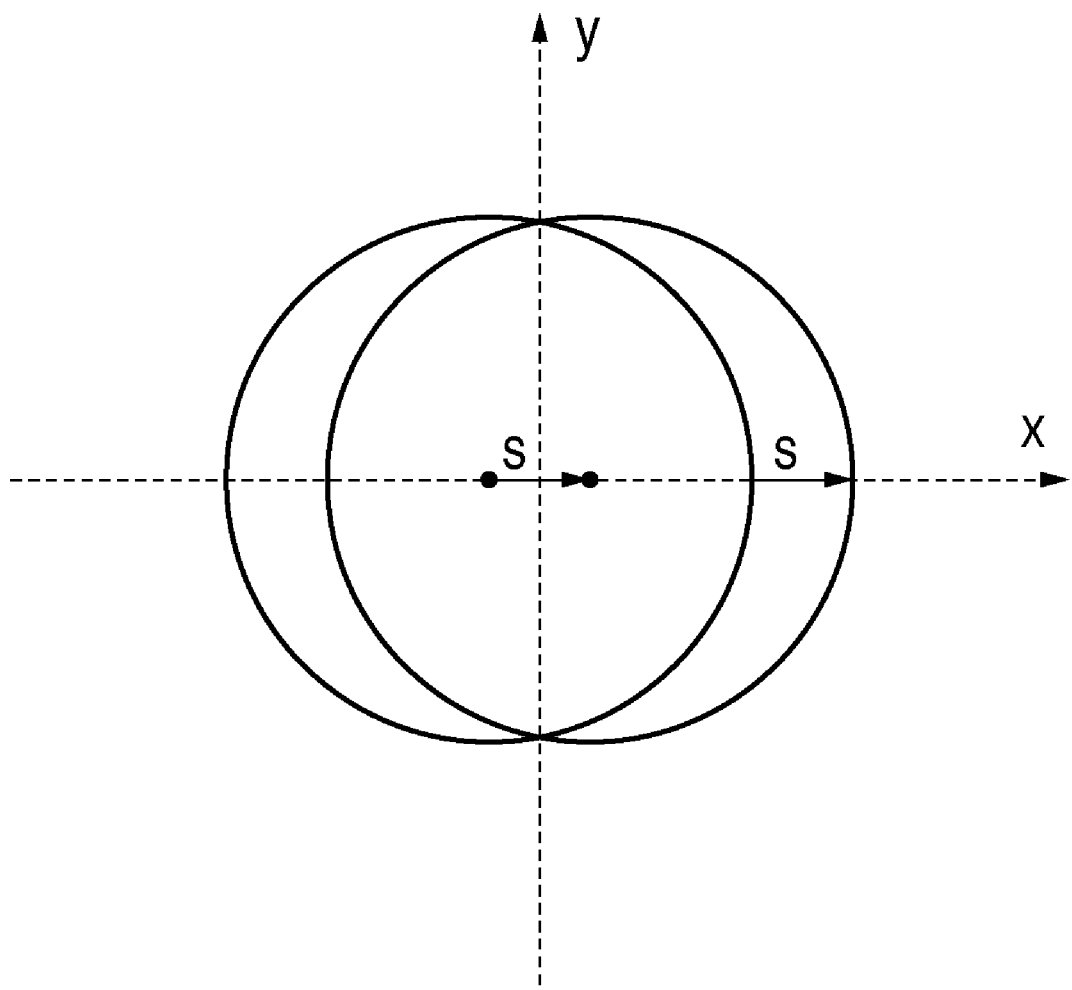
FIG. 2 is a view for explaining a shearing interferometer.

As shown in FIG. 2, the shearing interferometer superposes the two shifted (sheared) wavefronts of light beams which have passed through the projection optical system 30 as the optical system to be measured to obtain an interference pattern (interference fringe) from their difference in optical path length, using a diffraction grating. The interference pattern changes depending on an amount of shearing S of the wavefront shown in FIG. 2. Note that FIG. 2 is a view for explaining a shearing interferometer.

More specifically, the measurement apparatus measures the non-polarization aberration and polarization aberration of the projection optical system 30 as its optical characteristics. The non-polarization aberration means an aberration (e.g., the wavefront aberration) which does not depend on the polarization state of the light beam which enters the projection optical system 30 as the optical system to be measured. The polarization aberration means an aberration (e.g., the retardation and azimuth of birefringence) which depends on the polarization state of the light beam which enters the projection optical system 30 as the optical system to be measured. There are various known polarization aberration expression methods such as the Jones matrix and Mueller matrix.

For example, the polarization aberration of the projection optical system 30 as its optical characteristic is expressed by the Jones matrix:

$$\begin{bmatrix} J_{11} & J_{12} \\ J_{21} & J_{22} \end{bmatrix} \quad (1)$$

The $J_{12}$ and $J_{21}$ components are generally small because the projection optical system of the exposure apparatus is often made of a glass material with a small birefringence amount. Nowadays, however, the performance required for the exposure apparatus is becoming stricter. It is therefore necessary to precisely measure (calculate) even these diagonal components in expression (1) to measure the polarization aberration of the projection optical system 30 with a higher accuracy. The measurement apparatus of the exposure apparatus 1 can measure (calculate) all the components including the $J_{12}$ and $J_{21}$ components with high accuracy, as will be described later.

In measuring the optical characteristics of the projection optical system 30, the reticle inserted on the object plane of the projection optical system 30 is exchanged with the measurement reticle 20, and the collimator lens 40, wavefront splitting unit 50, second polarization control unit 60, and detection unit 70 are inserted on the side of the image plane of the projection optical system 30 (substrate reference position).

The measurement reticle 20 has an opening portion 22 such as a pinhole or slit. The opening portion 22 eliminates the aberration of the illumination optical system 10, which is contained in the light from the illumination optical system 10, to generate an ideal wavefront free from any aberration.

The collimator lens 40 collimates the light transmitted through the projection optical system 30 into nearly parallel light.

The wavefront splitting unit 50 splits the wavefront of the light which has passed through the projection optical system 30 as the optical system to be measured. The wavefront splitting unit 50 can constitute a shearing interferometer which splits the wavefront of the light which has passed through the projection optical system 30 and makes the split light beams interfere with each other. A diffraction grating (one-dimensional diffraction gratings, a two-dimensional diffraction grating, an amplitude grating, or a phase grating), a parallel plate, a semitransparent reflecting substrate, a plurality of mirrors, a prism, or the like is used as the wavefront splitting unit 50 in accordance with the type of the measurement reticle 20.

Combinations of the patterns of the measurement reticle 20 and wavefront splitting unit 50 will be explained herein with reference to FIG. 3.

(a) in FIG. 3 shows a case in which a reticle having a pinhole opening portion 22 is used as the measurement reticle 20, and a two-dimensional diffraction grating is used as the wavefront splitting unit 50. In this case, information on interference patterns sheared in the X and Y directions can be obtained from one interference pattern (interference fringe) detected by the detection unit 70 (to be described later).

Figure 4C:
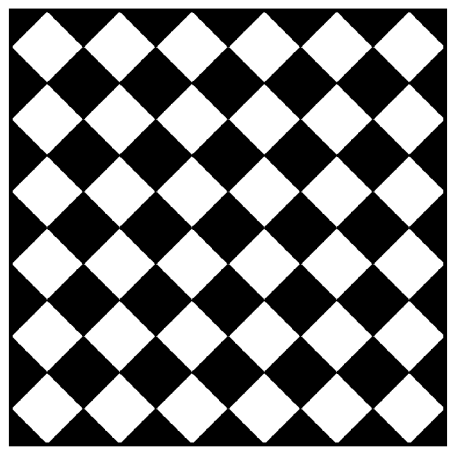
FIGS. 4A to 4C are views showing examples of a two-dimensional diffraction grating serving as the wavefront splitting unit in the measurement apparatus of the exposure apparatus shown in FIG. 1.
Figure 4B:
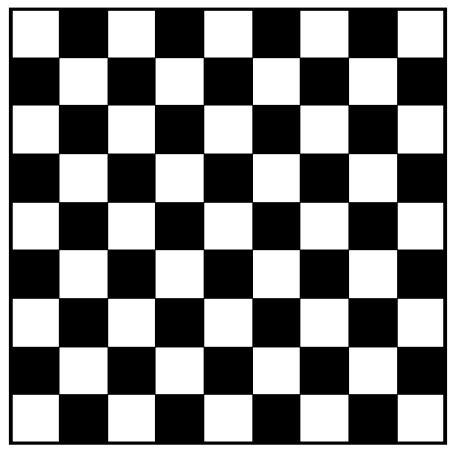
Figure 4A:
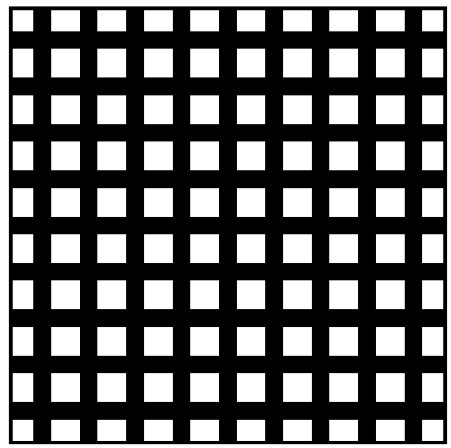

The two-dimensional diffraction grating serving as the wavefront splitting unit 50 can be, for example, a cross diffraction grating as shown in FIG. 4A, a checkered diffraction grating as shown in FIG. 4B, or a checkered diffraction grating as shown in FIG. 4C, which is obtained by rotating the checkered diffraction grating shown in FIG. 4B through 45°. However, the rotation angle of the checkered diffraction grating shown in FIG. 4B is not particularly limited to 45°, and may take any value. For example, by setting the rotation angle such that the array direction of the pixels of a CCD which constitutes the detection unit 70 does not match the diffraction direction of diffraction light generated by the diffraction grating, any error factors that occur in the pixels of the CCD can be eliminated. Hence, the detection unit 70 can detect the wavefront with high accuracy. The two-dimensional diffraction grating serving as the wavefront splitting unit 50 can be an amplitude grating or phase grating.

(b) in FIG. 3 shows a case in which a reticle having a pinhole opening portion 22 is used as the measurement reticle 20, and one-dimensional diffraction gratings are used as the wavefront splitting units 50. In this case, an interference pattern sheared in the X direction is detected by one one-dimensional diffraction grating, and that sheared in the Y direction is detected by the other one-dimensional diffraction grating perpendicular to the one one-dimensional diffraction grating. To obtain interference patterns sheared in two directions, two orthogonal one-dimensional diffraction gratings must be used. The one-dimensional diffraction gratings can be amplitude gratings or phase gratings, as in the two-dimensional diffraction grating.

(c) in FIG. 3 shows a case in which reticles having slit opening portions 22 are used as the measurement reticles 20, and one-dimensional diffraction gratings are used as the wavefront splitting units 50. The use of reticles having slit opening portions 22 as the measurement reticles 20 allows increasing the amount of light detected by the detection unit 70. The slit directions of the measurement reticles 20 must be matched with those of the one-dimensional diffraction gratings used as the wavefront splitting units 50. An interference pattern sheared in the X direction is detected using a measurement reticle 20 having a slit extending in the X direction and a one-dimensional diffraction grating extending in the X direction, and that sheared in the Y direction is detected using a measurement reticle 20 having a slit extending in the Y direction and a one-dimensional diffraction grating extending in the Y direction. To obtain interference patterns sheared in two directions, two orthogonal one-dimensional diffraction gratings must be used.

(d) in FIG. 3 shows a case in which a reticle having a pinhole opening portion 22 is used as the measurement reticle 20, and a semitransparent reflecting substrate is used as the wavefront splitting unit 50. In this case, shearing information in the radial direction can be obtained from one interference pattern.

Figure 5:
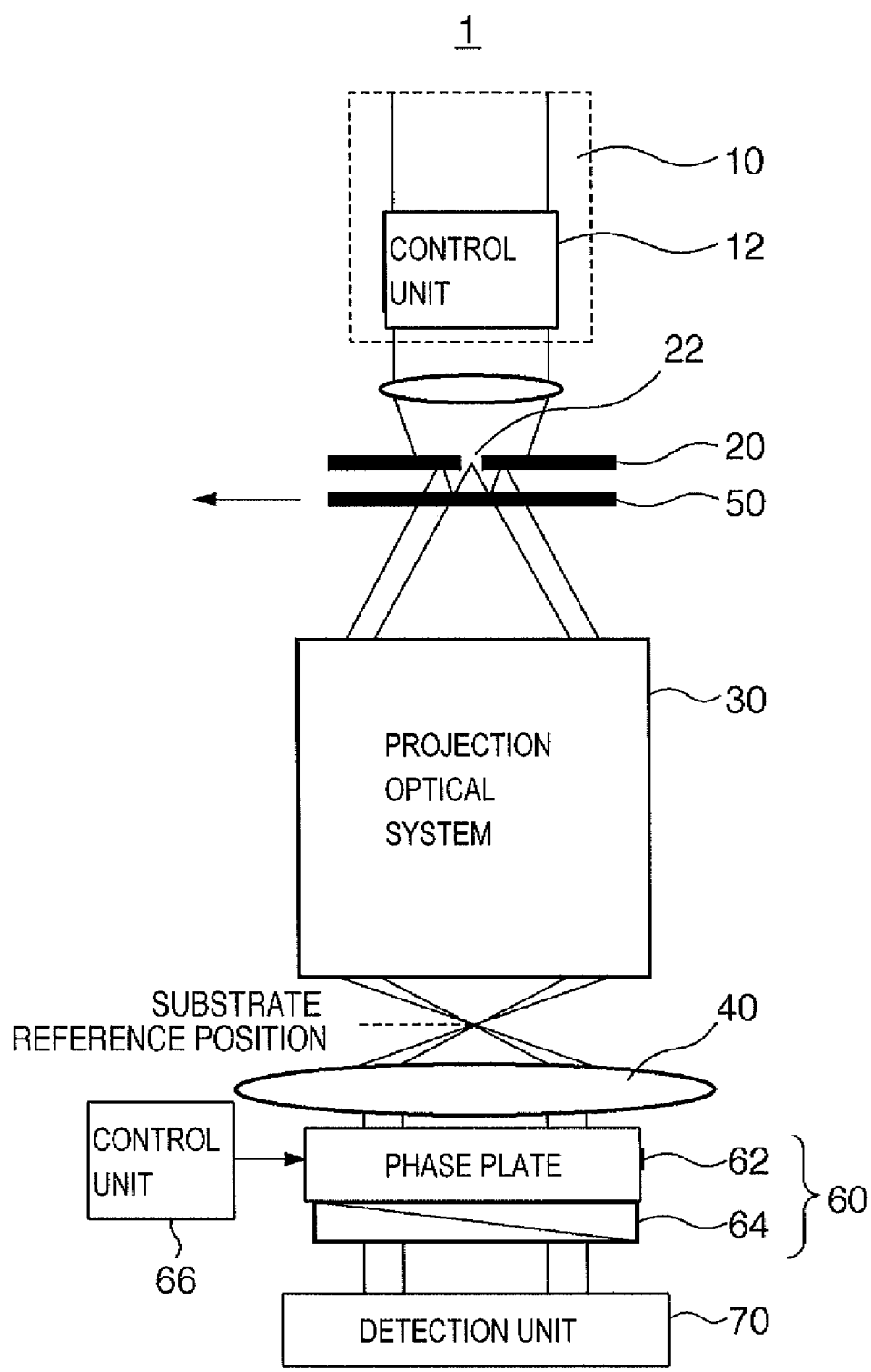
FIG. 5 is a schematic block diagram showing another exposure apparatus according to the first embodiment of the present invention.

The wavefront splitting unit 50 may be inserted between the projection optical system 30 and the detection unit 70, as shown in FIG. 1, or may be inserted between the measurement reticle 20 and the projection optical system 30, as shown in FIG. 5. In FIG. 5, a semitransparent reflecting substrate is used as the wavefront splitting unit 50. In this case, the wavefront splitting unit 50 constitutes a radial shearing interferometer which forms an interference pattern by guiding light reflected by the semitransparent reflecting substrate of the wavefront splitting unit 50, and that transmitted by the semitransparent reflecting substrate to interfere with each other. Note that FIG. 5 is a schematic block diagram showing another arrangement of the exposure apparatus 1 according to the first embodiment of the present invention.

The second polarization control unit 60 is inserted between the projection optical system 30 and the detection unit 70. The second polarization control unit 60 includes a phase plate 62 which can rotate about the optical axis, a fixed polarizer 64, and a control unit 66, and controls the polarization state of the light which has passed through the projection optical system 30. As will be described later, the control unit 66 controls the rotation of the phase plate 62 so that a plurality of interference patterns for each of light beams are sensed by an image sensor serving as the detection unit 70 in at least two polarization states generated by the first polarization control unit 12.

The detection unit 70 includes, for example, an image sensor such as a CCD. The detection unit 70 detects the light which has passed through the projection optical system 30, collimator lens 40, wavefront splitting unit 50, and second polarization control unit 60.

The processing unit 80 calculates the optical characteristics of the projection optical system 30 based on the plurality of interference patterns sensed by the image sensor serving as the detection unit 70. In other words, the processing unit 80 executes calculation processing necessary for the measurement of the optical characteristics (non-polarization aberration and polarization aberration) of the projection optical system 30 (to be described later).

The measurement of the optical characteristics of the projection optical system 30 will be explained in detail below. First, the first polarization control unit 12 inserted in the illumination optical system 10 generates at least two different polarization states of the light beams which enter the projection optical system 30. The first polarization control unit 12 has a function of controlling the polarization state of the light which enters the projection optical system 30 to at least two different polarization states.

The light from the illumination optical system 10 is shaped into an ideal wavefront upon passing through the opening portion 22 of the measurement reticle 20. The shaped wavefront turns into that containing the aberration information of the projection optical system 30 upon being transmitted through the projection optical system 30. The wavefront containing the aberration information of the projection optical system 30 is split by the wavefront splitting unit 50, and the split wavefronts pass through the second polarization control unit 60. The detection unit 70 detects (senses) an interference pattern obtained from the difference in optical path length between these two wavefronts split by the wavefront splitting unit 50.

The processing unit 80 analyzes the interference pattern information obtained by the detection unit 70 to calculate phase information related to the aberration of the projection optical system 30. Various calculation methods such as the phase shift method, FFT method, electronic moire method can be used to calculate the phase information of the projection optical system 30 from the interference pattern information. Note that when a shearing interferometer is used as in this embodiment, the phase information calculated by the processing unit 80 is the differential wavefront (differential phase) between the two divided wavefronts. In the wavefront obtained from the interference pattern detected by the detection unit 70, the non-polarization aberration and polarization aberration of the projection optical system 30 mix with each other. The use of only wavefront information obtained from a light beam in one polarization state is insufficient to separate the non-polarization aberration and polarization aberration of the projection optical system 30.

To separate the non-polarization aberration and polarization aberration of the projection optical system 30, a phase plate 62 which can rotate about the optical axis, and a polarizer 64 which cannot rotate about the optical axis are provided as the second polarization control unit 60. The polarizer 64 is fixed so as not to rotate about the optical axis of the projection optical system 30. The first polarization control unit 12 of the illumination optical system 10 generates light beams in two polarization states. In these two polarization states, the second polarization control unit 60 rotates the phase plate 62 about the optical axis while the polarizer 64 is fixed without being rotated about the optical axis. With this operation, the detection unit 70 obtains at least four detection results. Obtaining at least four detection results makes it possible to separate the non-polarization aberration and polarization aberration of the projection optical system 30 (i.e., to measure both the non-polarization aberration and polarization aberration of the projection optical system 30).

High-accuracy polarization state measurement requires azimuth information serving as a reference which stays constant (reference axis). Fixing the polarizer 64 in this way makes it possible to obtain the reference axis of the polarization state, thus always allowing high-accuracy polarization state measurement.

For example, assume that the polarizer 64 is inserted between the projection optical system 30 and the detection unit 70. In this case, a wavefront (measured wavefront) WP of the light detected by the detection unit 70 is given by:

$$WP = f(L, J, \alpha, \phi, \beta) \quad (2)$$

where L is the incident polarized light beam, J is the Jones matrix of the projection optical system 30, $\phi$ is the phase difference of the phase plate 62, $\alpha$ is the rotation angle of the phase plate 62, and $\beta$ is the rotation angle of the polarizer 64.

For example, when a $\lambda/2$ plate is used as the phase plate 62, and the rotation angle, that is, transmission axis of the polarizer 64 is $\theta°$, the optical characteristics of the projection optical system 30 are calculated based on the results of polarization state measurement under the following four measurement conditions. The four measurement conditions herein mean cases in which the first polarization control unit 12 generates two different linearly polarized light beams ($\theta+45°$ and $\theta-45°$) and rotates the phase plate 62 ($\lambda/2$ plate) through $\theta°$ and $\theta+45°$ while the polarizer 64 is fixed. Wavefronts WP1 to WP4 under these four measurement conditions are given by:

$$WP1 = f(\theta+45, J, \theta, \lambda/2, \theta)$$

$$WP2 = f(\theta-45, J, \theta, \lambda/2, \theta)$$

$$WP3 = f(\theta+45, J, \theta+45, \lambda/2, \theta)$$

$$WP4 = f(\theta-45, J, \theta+45, \lambda/2, \theta) \quad (3)$$

The non-polarization aberration and polarization aberration of the projection optical system 30 can be separately calculated under the four measurement conditions (wavefronts WP1 to WP4) as a polarization state measurement example. Two incident polarized light beams perpendicular to the transmission axis $\theta$ of the polarizer 64 are polarized in different $\pm 45°$ directions.

A method of separately calculating the non-polarization aberration and polarization aberration of the projection optical system 30 will be explained. For the sake of descriptive simplicity, a case in which the second polarization control unit 60 (phase plate 62 and polarizer 64) is not provided, and four incident polarized light beams are used will be exemplified herein. Because the non-polarization aberration does not depend on the polarization state of the incident light beam, it remains the same irrespective of the polarization direction of a light beam used, as described above. In contrast, the polarization aberration changes depending on the polarization direction of the incident light beam, and the phase difference and rotation angle of the phase plate 62. The wavefronts (measured wavefronts) measured for the four incident polarized light beams are given by:

0° polarized wavefront=non-polarization aberration+ polarization aberration (0°)

90° polarized wavefront=non-polarization aberration+ polarization aberration (90°)

45° polarized wavefront=non-polarization aberration+ polarization aberration (45°)

−45° polarized wavefront=non-polarization aberration+polarization aberration (−45°) (4)

The fast axis and slow axis which represent the azimuth of birefringence as the polarization aberration are orthogonal to each other. If the fast axis is oriented in the 0° direction, the slow axis is oriented in the 90° direction. Likewise, if the fast axis is oriented in the 45° direction, the slow axis is oriented in the −45° direction.

For example, assume that the fast axis of the birefringence of the projection optical system 30 is oriented in the 0° direction. In this case, if the 0° linearly polarized light beam enters the projection optical system 30, the fast axis of the birefringence matches the polarization direction of the incident polarized light beam, and the wavefront advances from the non-polarization aberration by the amount of retardation as a whole. On the other hand, if the 90° linearly polarized light beam enters the projection optical system 30, the slow axis of the birefringence matches the polarization direction of the incident polarized light beam, and the wavefront lags behind the non-polarization aberration by the amount of retardation as a whole. Assume that the wavefront advance direction is the plus direction, and the wavefront lag direction is the minus direction. In this case, the signs of the polarized wavefronts of these light beams are opposite to each other, and the same applies to the relationship between the 45° incident polarized light beam and the −45° incident polarized light beam as follows:

polarization aberration (0°)=−(polarization aberration) (90°)

polarization aberration (45°)=−(polarization aberration) (−45°) (5)

In view of this, equations (4) are rewritten into:

0° incident wavefront=non-polarization aberration+ polarization aberration (0°)

90° incident wavefront=non-polarization aberration− polarization aberration (0°)

45° incident wavefront=non-polarization aberration+ polarization aberration (45°)

−45° incident wavefront=non-polarization aberration+ polarization aberration (45°) (6)

Referring to equations (6), the non-polarization aberration and polarization aberration are separated by:

$$\begin{aligned}
\text{non-polarization aberration} &= (0° \text{ incident wavefront} + \\
&\quad 90° \text{ incident wavefront})/2 \\
&= (45° \text{ incident wavefront} + \\
&\quad (-45° \text{ incident wavefront}))/2 \\
&= (0° \text{ incident wavefront} + \\
&\quad 90° \text{ incident wavefront} +
\end{aligned}$$

$$45° \text{ incident wavefront}+$$
$$(-45° \text{ incident wavefront}))/4$$

polarization aberration (0°)=(0° incident wavefront−
90° incident wavefront)/2 polarization aberration (45°)=(45° incident wavefront−(−45° incident wavefront))/2 (7)

In this manner, to separate the non-polarization aberration and polarization aberration of the projection optical system 30, it is important to measure the wavefronts using a plurality of light beams which exhibit different polarization states (polarization directions).

When the wavefronts are measured using the 0° linearly polarized light beam, 90° linearly polarized light beam, 45° linearly polarized light beam, and −45° linearly polarized light beam, the non-polarization aberration and polarization aberration of the projection optical system 30 can be separated (see equations (7)). Although a case in which four incident polarized light beams are used has been exemplified herein, the −45° incident wavefront can be calculated based on three wavefronts, that is, the 0° incident wavefront, 90° incident wavefront, and 45° incident wavefront, as is obvious from equations (7). By measuring the wavefronts using three, that is, 0°, 90°, and 45° incident polarized light beams, the non-polarization aberration and polarization aberration of the projection optical system 30 can be separately calculated.

The relationships between the wavefronts measured by changing the incident polarized light beam without using the second polarization control unit 60 (phase plate 62 and polarizer 64), and the wavefronts WP1 to WP4 measured assuming that the transmission axis θ of the polarizer 64 is 0° by providing the second polarization control unit 60 satisfy:

0° incident wavefront=WP1+WP2

90° incident wavefront=WP3+WP4

45° incident wavefront=WP1+WP3

−45° incident wavefront=WP2+WP4 (8)

The non-polarization aberration and polarization aberrations (0°) and (45°) are calculated by:

non-polarization aberration=((WP1+WP2)+(WP3+WP4))/2 polarization aberration (0°)=((WP1+WP2)−(WP3+WP4))/2 polarization aberration (45°)=((WP1+WP3)−(WP2+WP4))/2 (9)

In this manner, the measurement apparatus of the exposure apparatus 1 according to the first embodiment can measure both the non-polarization aberration and polarization aberration of the projection optical system 30 while the polarizer 64 is fixed. Using the θ+45° linearly polarized light beam and θ−45° linearly polarized light beam for the polarizer 64 (θ°), the wavefronts can be measured under measurement conditions under which the amount of light detected by the detection unit 70 is most favorable. In other words, by optimizing the polarization direction of the incident polarized light beam for the fixed polarizer 64, the non-polarization aberration and polarization aberration of the projection optical system 30 can be measured with high accuracy.

For example, assume that the transmission axis of the polarizer 64 is 0°, and the polarization direction of the incident linearly polarized light beam is 0°. In this case, since the amount of light detected by the detection unit 70 is very large, the non-polarization aberration and polarization aberration of the projection optical system 30 can be measured satisfactorily. However, when the transmission axis of the polarizer 64 is rotated through 90°, only leaked light components are detected. If the birefringence amount is small, the light amount becomes very small. This makes it impossible to measure the non-polarization aberration and polarization aberration of the projection optical system 30 with high accuracy. The leaked light components correspond to the diagonal components $J_{12}$ and $J_{21}$ of the Jones matrix (see expression (1)).

To solve this problem, the measurement apparatus of the exposure apparatus 1 according to the first embodiment sets the polarization directions of incident linearly polarized light beams (i.e., at least two linearly polarized light beams) to be different from the transmission axis of the polarizer 64. In particular, the polarization directions of the incident linearly polarized light beams are preferably different from the transmission axis of the polarizer 64 by 45°. With this setting, a satisfactory light amount can be obtained under all the measurement conditions, although it is small as compared with a case in which the transmission axis of the polarizer 64 matches the polarization direction of the incident linearly polarized light beam. This makes it possible to measure the non-polarization aberration and polarization aberration of the projection optical system 30 with high accuracy.

A case in which a λ/2 plate is used as the phase plate 62 of the second polarization control unit 60 has been exemplified herein. However, the phase difference of the phase plate 62 is not particularly limited to λ/2, and the same effect can be produced even by using a phase plate having a phase difference other than λ/2 as the phase plate 62, or another optical element such as the Fresnel rhomb. Thus, for example, when using the λ/2 plate, the phase difference may shift slightly from λ/2 due to fabrication error. In this case, a higher accuracy measurement can be executed by correctly measuring a phase difference of a phase plate to be used, optimizing two incident polarized light beams and finely adjusting a rotation angle of a phase shifter, etc., to convert the incident polarized light beam into an elliptically polarized light, etc. In other words, at least two polarization states used for the measurement are preferably determined based on a direction of a transmission axis of the polarizer and a phase difference and rotation angle of the phase plate. Also, the above-described measurement conditions are merely examples, and there are various measurement conditions to obtain at least four detection results by rotating the phase plate 62 for light beams in at least two polarization states. Also, the conditions of the incident polarized light beams are not particularly limited to those described above, and light beams linearly polarized along other angles or light beams such as circularly polarized light beams or elliptically polarized light beams other than linearly polarized light beams may be used. By increasing the number of incident polarized light beams and the number of rotation angles of the phase plate 62 (i.e., the measurement conditions), and the number of measured wavefronts, the non-polarization aberration and polarization aberration of the projection optical system 30 can be calculated with a higher accuracy.

The thus calculated non-polarization aberration and polarization aberration of the projection optical system 30 each are the differential phase between two wavefronts, as described above. The calculation of a true non-polarization aberration and polarization aberration requires integration processing. The non-polarization aberration can be calculated even from the differential phase, but the polarization aberration requires at least one reference birefringence information. Although data measured separately may be used, their measurement conditions such as the holding method, measurement environment, and thermal aberration are different from actual measurement conditions. High-accuracy polarization aberration measurement requires quickly measuring even the reference birefringence information under the same environment.

The reference birefringence information is measured in the following way. In measuring the reference birefringence, the wavefront splitting unit 50 need only be removed from the optical path (i.e., the wavefront splitting unit 50 not be inserted in the optical path). As the wavefront splitting unit 50 is removed from the optical path, the collimator lens 40 and second polarization control unit 60 (phase plate 62 and polarizer 64) are inserted on the side of the image plane of the projection optical system 30. With this arrangement, a measurement apparatus which measures the polarized light intensity of the projection optical system 30 is implemented.

In measuring the polarized light intensity of the projection optical system 30, the first polarization control unit 12 of the illumination optical system 10 forms incident linearly polarized light first. The incident linearly polarized light from the illumination optical system 10 turns into elliptically polarized light upon passing through the projection optical system 30 due to the polarization aberration of the projection optical system 30. The phase plate 62 is rotated through at least three rotation angles, and the light intensity distribution of the light which has passed through the polarizer 64 is detected at each rotation angle.

In this manner, the polarization aberration of the projection optical system 30 can be obtained by analyzing the polarization state of elliptically polarized light obtained as the light passes through the projection optical system 30, using the second polarization control unit 60 (phase plate 62 and polarizer 64). However, the polarized light intensities of a plurality of different incident polarized light beams may be measured without rotating the phase plate 62. Alternatively, the number of polarized light intensity measurement results (measurement conditions) may be increased by rotating the phase plate 62 in addition to the use of a plurality of different incident polarized light beams.

Here, in this embodiment, since the wavefront splitting unit attached and detached is not sensitive to the alignment accuracy in an attachment and detachment direction (orthogonal direction to the optical axis), the wavefront splitting unit has the feature that an error by attachment and detachment is very small. When attaching and detaching the whole unit including the optical system etc., very high alignment accuracy with the optical axis of the optical system is required, and this alignment error causes accuracy deterioration. However, in this embodiment, since the wavefront splitting unit attached and detached is not sensitive to the alignment accuracy in the attachment and detachment direction, restrictions of the alignment accuracy are very loose, and the measurement with high accuracy can be achieved.

To measure (calculate) the non-polarization aberration and polarization aberration of the projection optical system 30 with a higher accuracy, it is necessary to separate the aberration of the projection optical system 30 and the so-called system aberration such as the aberration of the collimator lens 40. To measure the system aberration, for example, the above-described interference pattern and polarized light intensity need only be measured while the aberration information of the projection optical system 30 is eliminated by setting a pinhole at the substrate reference position.

More specifically, assume cases in which a pinhole is inserted on the object plane of the projection optical system 30 and in which a pinhole is set at the substrate reference position. In both cases, the interference pattern is measured by inserting the wavefront splitting unit 50 into the optical path, and the polarized light intensity is measured by removing the wavefront splitting unit 50 from the optical path. By subtracting the system aberration measured by setting a pinhole at the substrate reference position from the aberration measured by inserting a pinhole on the object plane of the projection optical system 30, the aberration of the projection optical system 30 can be measured (calculated) precisely.

The exposure apparatus 1 adjusts and controls at least one of the illumination optical system 10 and projection optical system 30 based on the non-polarization aberration and polarization aberration of the projection optical system 30 measured by the measurement apparatus (i.e., calculated by the processing unit 80). The non-polarization aberration of the projection optical system 30 depends on the shapes and surface intervals of its lenses. For this reason, the projection system control unit 100 adjusts, for example, the shapes and surface intervals of the lenses of the projection optical system 30 based on the non-polarization aberration of the projection optical system 30 measured by the measurement apparatus. In addition, the projection system control unit 100 changes, for example, the holding states of the lenses of the projection optical system 30 so as to reduce the polarization aberration, based on the polarization aberration of the projection optical system 30 measured by the measurement apparatus. The illumination system control unit 90 adjusts, for example, the in-plane polarization state and illumination distribution in the illumination optical system 10 so as to guide the illumination light onto the wafer in an optimal state, based on the polarization aberration of the projection optical system 30 measured by the measurement apparatus.

The non-polarization aberration and polarization aberration are preferably, eventually minimized on the wafer surface. The non-polarization aberration and polarization aberration may be minimized by repeating the measurement of the optical characteristics (non-polarization aberration and polarization aberration) of the projection optical system 30, and the adjustment of the illumination optical system 10 and projection optical system 30.

In this manner, the measurement apparatus of the exposure apparatus 1 according to the first embodiment can measure both the non-polarization aberration and the polarization aberration (the retardation and azimuth of birefringence) of the projection optical system as its optical characteristics, while the projection optical system is mounted in the exposure apparatus, with high accuracy in a short period of time.

Second Embodiment

Figure 6:
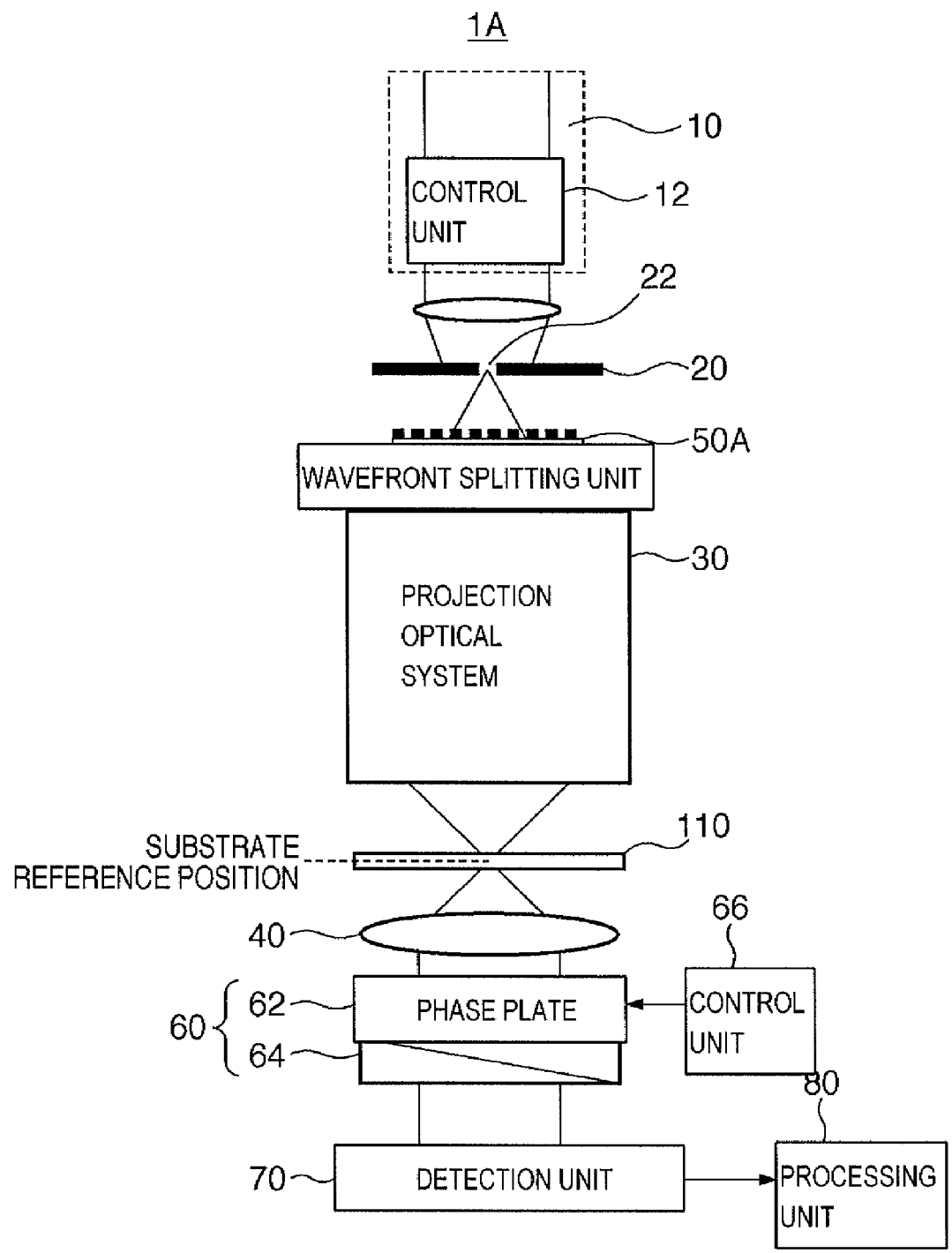
FIG. 6 is a schematic block diagram showing an exposure apparatus according to a second embodiment of the present invention.

FIG. 6 is a schematic block diagram showing the arrangement of an exposure apparatus 1A according to the second embodiment of the present invention. Although the exposure apparatus 1A has an arrangement and functions similar to those of the exposure apparatus 1 according to the first embodiment, a measurement apparatus provided to the exposure apparatus 1A has an arrangement different from that of the measurement apparatus provided to the exposure apparatus 1. The measurement apparatus measures the non-polarization aberration and polarization aberration of a projection optical system 30 as its optical characteristics, and constitutes a point diffraction interferometer (PDI). The point diffraction interferometer is a common path interferometer, which is less likely to come under the influence of vibration because of its simple optical path and arrangement. Note that an illumination system control unit 90 and projection system control unit 100 are not illustrated in FIG. 6.

The measurement apparatus of the exposure apparatus 1A according to the second embodiment includes an illumination optical system 10, measurement reticle 20, collimator lens 40, wavefront splitting unit 50A, second polarization control unit 60, detection unit 70, processing unit 80, and wafer-side measurement pattern 110.

In measuring the optical characteristics of the projection optical system 30, the reticle inserted on the object plane of the projection optical system 30 is exchanged with the measurement reticle 20, and the wavefront splitting unit 50A is inserted between the measurement reticle 20 and the projection optical system 30. The wafer-side measurement pattern 110 is set near the substrate reference position.

Figure 7A:
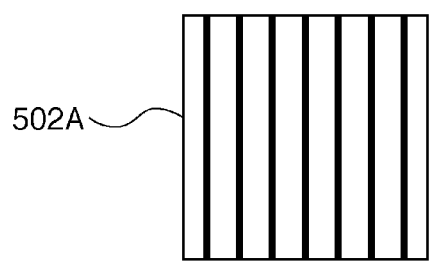
FIGS. 7A and 7B are views showing the structures of one-dimensional diffraction gratings serving as wavefront splitting units in a measurement apparatus of the exposure apparatus shown in FIG. 6.
Figure 7B:
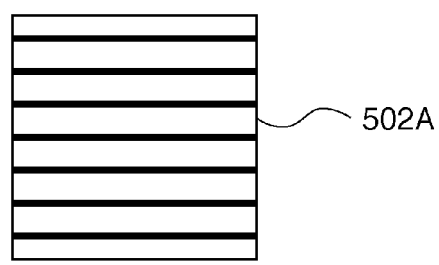

The wavefront splitting unit 50A has a function of splitting the wavefront of light which enters the projection optical system 30 as the optical system to be measured. In this embodiment, the wavefront splitting units 50A are formed by one-dimensional diffraction gratings 502A, as shown in FIGS. 7A and 7B. The grating directions of the one-dimensional diffraction gratings 502A shown in FIGS. 7A and 7B are orthogonal to each other. In other words, the one-dimensional diffraction gratings 502A shown in FIGS. 7A and 7B have 90° rotational symmetry. However, the wavefront splitting units 50A are not particularly limited to the one-dimensional diffraction gratings 502A, and CGHs (Computer Generated Holograms) or the like may be used. Note that FIGS. 7A and 7B are views showing the structures of one-dimensional diffraction gratings serving as the wavefront splitting units 50A.

Figure 8A:
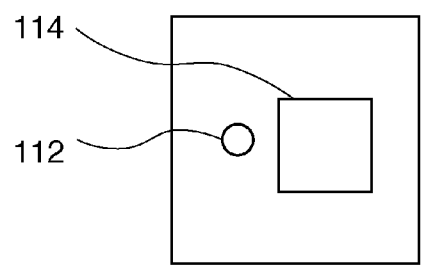
FIGS. 8A and 8B are views showing the structures of wafer-side measurement patterns in the measurement apparatus of the exposure apparatus shown in FIG. 6.
Figure 8B:
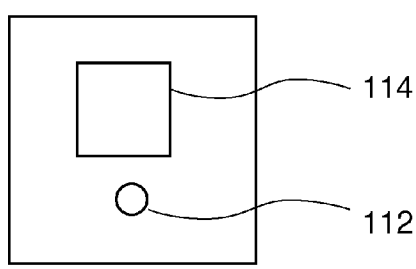

The wafer-side measurement pattern 110 has a pinhole 112 and window 114, as shown in FIGS. 8A and 8B. The alignment directions of the pinholes 112 and windows 114 of the wafer-side measurement patterns 110 shown in FIGS. 8A and 8B are orthogonal to each other. In other words, the wafer-side measurement patterns 110 shown in FIGS. 8A and 8B have 90° rotational symmetry. Note that FIGS. 8A and 8B are views showing the structures of the wafer-side measurement patterns 110.

The one-dimensional diffraction grating 502A serving as the wavefront splitting unit 50A and the wafer-side measurement pattern 110 must be set such that the grating direction of the one-dimensional diffraction grating 502A matches the alignment direction of the pinhole 112 and window 114 of the wafer-side measurement pattern 110. The grating pitch and slit size of the one-dimensional diffraction grating 502A and the specific dimensions of, for example, the pinhole 112 of the wafer-side measurement pattern 110 are optimized as needed, in accordance with the measurement accuracy.

The one-dimensional diffraction grating 502A is inserted between the measurement reticle 20 and the projection optical system 30 in the state shown in FIG. 7A. The wafer-side measurement pattern 110 is set near the substrate reference position in the state shown in FIG. 8A. The light from the illumination optical system 10 is shaped into an ideal wavefront, which contains no aberration of the illumination optical system 10, upon passing through the opening portion 22 of the measurement reticle 20. The light which has passed through the opening portion 22 of the measurement reticle 20 is split into two by the one-dimensional diffraction grating 502A so that the split light beams enter the projection optical system 30 with slightly shifted wavefronts. The wavefronts of these two light beams change depending on the wavefront aberration of the projection optical system 30. One of these two light beams which emerge from the projection optical system 30 is shaped into an ideal wavefront again upon passing through the pinhole 112 of the wafer-side measurement pattern 110. The other one of these two light beams which emerge from the projection optical system 30 passes through the window 114 of the wafer-side measurement pattern 110. The wavefront of the light beam which has passed through the window 114 contains the aberration information of the projection optical system 30.

The ideal wavefront which has passed through the pinhole 112, and the wavefront containing the aberration information of the projection optical system 30 are collimated into nearly parallel light beams by the collimator lens 40, pass through the second polarization control unit 60 (phase plate 62 and polarizer 64), and are detected by the detection unit 70. With this operation, one interference pattern can be obtained.

The one-dimensional diffraction grating 502A is rotated through 90° and inserted between the measurement reticle 20 and the projection optical system 30 in the state shown in FIG. 7B. The wafer-side measurement pattern 110 is rotated through 90° and set near the substrate reference position in the state shown in FIG. 8B. Likewise, one interference pattern is obtained from an ideal wavefront which has passed through the pinhole 112, and a wavefront containing the aberration information of the projection optical system 30 upon passing through the window 114.

Synthesizing the thus obtained two interference patterns makes it possible to obtain the wavefront information as a change in the aberration of the projection optical system 30.

As in the first embodiment, in the second polarization control unit 60, the polarizer 64 is fixed between the projection optical system 30 and the detection unit 70. The phase plate 62 is inserted between the projection optical system 30 and the detection unit 70, and can rotate about the optical axis.

A first polarization control unit 12 of the illumination optical system 10 generates light beams (incident polarized light beams) in at least two different polarization states. By rotating the phase plate 62 for the respective light beams in these two polarization states, at least four wavefronts (measured wavefronts) can be obtained. With this operation, the processing unit 80 can calculate the non-polarization aberration and polarization aberration of the projection optical system 30 from the four wavefronts, as in the first embodiment.

In this manner, the measurement apparatus of the exposure apparatus 1A according to the second embodiment can measure both the non-polarization aberration and the polarization aberration (the retardation and azimuth of birefringence) of the projection optical system as its optical characteristics, while the projection optical system is mounted in the exposure apparatus, with high accuracy in a short period of time. Since the measurement apparatus constitutes a point diffraction interferometer, two measurement directions are necessary for one wavefront. To obtain four wavefronts, measurement in two measurement directions is necessary for each wavefront, that is, a total of eight times of measurement is necessary.

The measurement apparatus of the exposure apparatus 1 according to the first embodiment constitutes a shearing interferometer, and measures the differential wavefront of the projection optical system 30. In contrast, the measurement apparatus of the exposure apparatus 1A according to the second embodiment measures the interference pattern between an ideal wavefront which has passed through the pinhole 112 and an aberration wavefront which has passed through the window 114, and therefore the measured aberration wavefront serves as the aberration information of the projection optical system 30. This obviates the need for reference birefringence in calculating the polarization aberration. As long as the detection unit 70 detects the interference pattern, the non-polarization aberration and polarization aberration of the projection optical system 30 as its optical characteristics can be calculated. In other words, there is no need to measure the polarized light intensity by removing the wavefront splitting unit 50 from the optical path. This obviates the need for a driving unit for driving the wavefront splitting unit 50, which makes it possible to simplify the arrangement of the measurement apparatus.

To measure the non-polarization aberration and polarization aberration of the projection optical system 30 with a higher accuracy, it is necessary to separate the aberration of the projection optical system 30 and the so-called system aberration such as the aberration of the collimator lens 40. To measure the system aberration, for example, the above-described measurement need only be performed by exchanging the window 114 of the wafer-side measurement pattern 110 with a pinhole. By subtracting the system aberration from the aberration measured at this time, the aberration of the projection optical system 30 can be measured precisely.

Although the illumination optical system 10, measurement reticle 20 (opening portion 22), and one-dimensional diffraction grating 502A are set in this order in the second embodiment, they may be set in the order of the illumination optical system 10, one-dimensional diffraction grating 502A, and measurement reticle 20 (opening portion 22). In other words, the measurement reticle 20 (opening portion 22) and one-dimensional diffraction grating 502A may be set in the order reverse to that described above. As in the wafer-side measurement pattern 110, a pinhole and window are formed in the measurement reticle 20 so that one of two light beams split by the one-dimensional diffraction grating 502A enters the pinhole and the other one of them enters the window. The light beam which has passed through the pinhole of the measurement reticle 20 further passes through the window 114 of the wafer-side measurement pattern 110. The light beam which has passed through the window of the measurement reticle 20 further passes through the pinhole 112 of the wafer-side measurement pattern 110. This makes it possible to ensure a good balance in light amount between the two interfering wavefronts, thus obtaining a high-contrast interference pattern.

Third Embodiment

Figure 9:
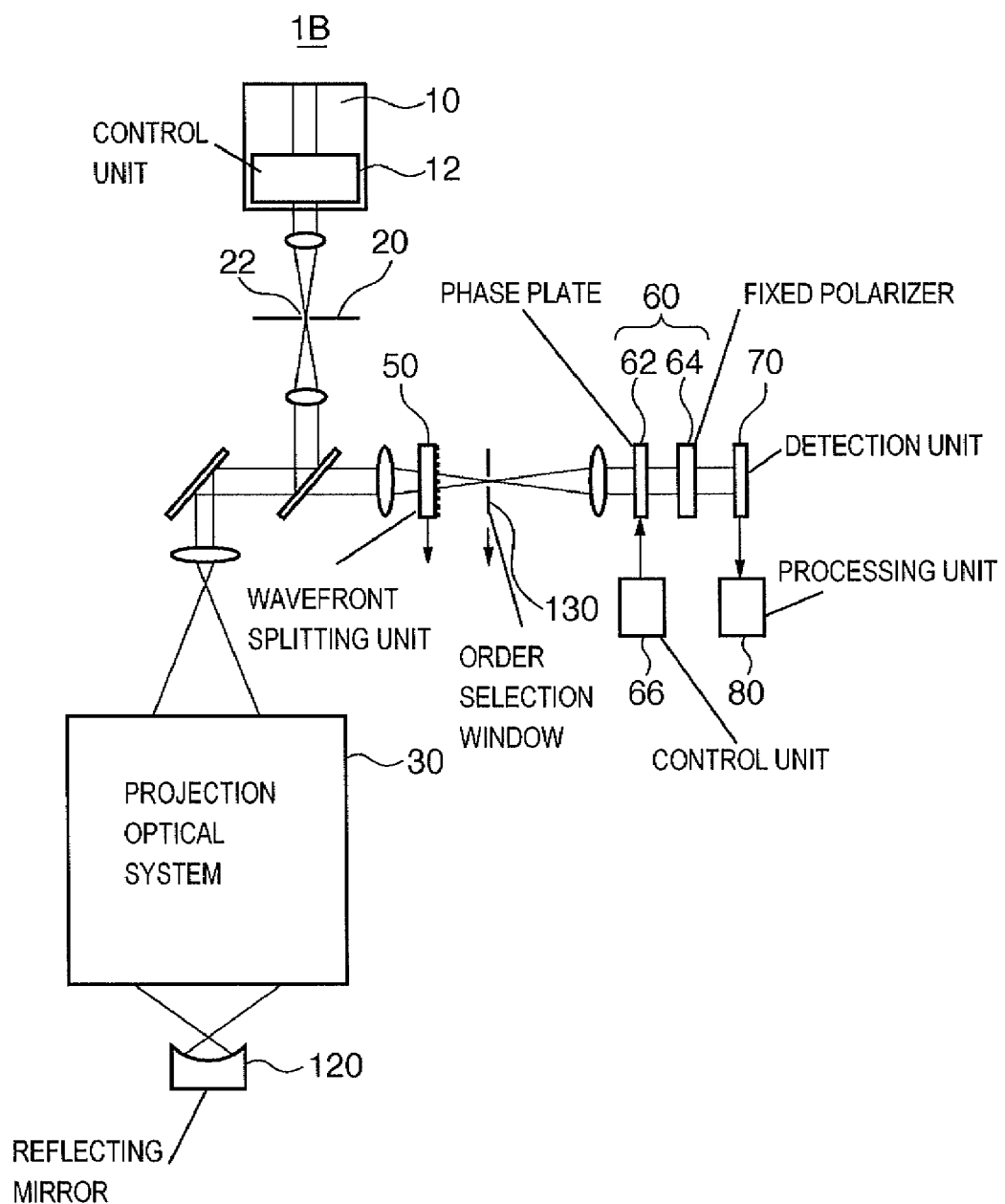
FIG. 9 is a schematic block diagram showing an exposure apparatus according to a third embodiment of the present invention.

FIG. 9 is a schematic block diagram showing the arrangement of an exposure apparatus 1B according to the third embodiment of the present invention. Although the exposure apparatus 1B has an arrangement and functions similar to those of the exposure apparatus 1 according to the first embodiment, a measurement apparatus provided to the exposure apparatus 1B has an arrangement different from that of the measurement apparatus provided to the exposure apparatus 1. The measurement apparatus includes a wavefront splitting unit 50, second polarization control unit 60 (phase plate 62 and polarizer 64), and detection unit 70 on the side of the object plane of a projection optical system 30 (i.e., on the reticle side). In other words, the measurement apparatus of the exposure apparatus 1B constitutes a shearing interferometer on the side of the object plane of the projection optical system 30, and measures the non-polarization aberration and polarization aberration of the projection optical system 30 as its optical characteristics. The shearing interferometer constituted on the side of the object plane of the projection optical system 30 is a common path interferometer, which is less likely to come under the influence of vibration because of its simple optical path and arrangement. Note that an illumination system control unit 90 and projection system control unit 100 are not illustrated in FIG. 9.

The measurement apparatus of the exposure apparatus 1B according to the third embodiment includes an illumination optical system 10, a measurement reticle 20, the wavefront splitting unit 50, the second polarization control unit 60, the detection unit 70, a processing unit 80, and a reflecting mirror 120. The measurement apparatus of the exposure apparatus 1B according to the third embodiment reflects the light which has passed through the projection optical system 30 by the reflecting mirror 120, and detects the wavefront which has passed through the projection optical system 30 again by the detection unit 70 inserted on the object plane of the projection optical system 30. The shearing interferometer must measure both the interference pattern and polarized light intensity because that wavefront is a differential wavefront.

Since the measurement apparatus of the exposure apparatus 1B according to the third embodiment detects the light which has passed through the projection optical system 30 twice, it has a merit that the amount of aberration of the projection optical system 30 increases to twice that in the measurement apparatus constituted on the side of the image plane of the projection optical system 30 (on the wafer side) as in the second embodiment. In recent years, as the amount of aberration of the projection optical system is enormously decreasing, the merit of detecting the aberration amount by increasing it is great. Since the light which emerges from the side of the object plane of the projection optical system 30 has a relatively low numerical aperture, it is readily collimated. This makes it possible to improve the degree of freedom of the layout of constituent members.

As in the first embodiment, a diffraction grating is used as the wavefront splitting unit 50. The wavefront splitting unit 50 can be inserted/removed into/from the optical path. When the wavefront splitting unit 50 is inserted in the optical path, the detection unit 70 can detect the interference pattern. When the wavefront splitting unit 50 is removed from the optical path, the detection unit 70 can detect the light intensity.

In measuring the optical characteristics of the projection optical system 30, the wavefront splitting unit 50 is inserted into the optical path first. Incident polarized light generated by a first polarization control unit 12 of the illumination optical system 10 is shaped into an ideal wavefront upon passing through an opening portion 22 of the measurement reticle 20. The light which has passed through the opening portion 22 of the measurement reticle 20 turns into that containing the non-polarization aberration and polarization aberration of the projection optical system 30 upon passing through the projection optical system 30. The light which emerges from the side of the image plane of the projection optical system 30 is reflected by the reflecting mirror 120, passes through the projection optical system 30 again, and emerges from the side of the object plane of the projection optical system 30. The wavefront of the light which emerges from the side of the object plane of the projection optical system 30 is split by the wavefront splitting unit 50, passes through the second polarization control unit 60 (phase plate 62 and polarizer 64), and is detected by the detection unit 70 as an interference pattern.

As in the first embodiment, in the second polarization control unit 60, the polarizer 64 is fixed between the projection optical system 30 and the detection unit 70. The phase plate 62 is inserted between the projection optical system 30 and the detection unit 70, and can rotate about the optical axis.

The first polarization control unit 12 of the illumination optical system 10 generates light beams (incident polarized light beams) in at least two different polarization states. By rotating the phase plate 62 for the respective light beams in these two polarization states, at least four interference patterns can be obtained.

The wavefront splitting unit 50 is removed from the optical path, and the polarized light intensity is measured. More specifically, the first polarization control unit 12 of the illumination optical system 10 generates predetermined incident polarized light, rotates the phase plate 62, and detects a change in intensity. At least one polarization aberration data is calculated and set as reference birefringence.

The processing unit 80 calculates the non-polarization aberration and polarization aberration of the projection optical system 30 as its optical characteristics based on the reference birefringence obtained from the polarized light intensity, and the differential wavefronts obtained from the interference patterns.

In this manner, the measurement apparatus of the exposure apparatus 1B according to the third embodiment can measure both the non-polarization aberration and the polarization aberration (the retardation and azimuth of birefringence) of the projection optical system as its optical characteristics, while the projection optical system is mounted in the exposure apparatus, with high accuracy in a short period of time.

To measure the non-polarization aberration and polarization aberration of the projection optical system 30 with a higher accuracy, it is necessary to separate the aberration of the projection optical system 30 and the so-called system aberration such as the aberration of a collimator lens 40. To measure the system aberration, for example, the interference pattern and polarized light intensity need only be measured, as described above, by inserting the reflecting mirror 120 on the side of the object plane of the projection optical system 30.

More specifically, assume cases in which the reflecting mirror 120 is inserted on the side of the object plane of the projection optical system 30 and in which the reflecting mirror 120 is inserted on the side of the image plane of the projection optical system 30. In both cases, the interference pattern is measured by inserting the wavefront splitting unit 50 into the optical path, and the polarized light intensity is measured by removing the wavefront splitting unit 50 from the optical path. By subtracting the system aberration measured by inserting the reflecting mirror 120 on the side of the object plane of the projection optical system 30 from the aberration measured by inserting the reflecting mirror 120 on the side of the image plane of the projection optical system 30, the aberration of the projection optical system 30 can be measured precisely.

Figure 10:
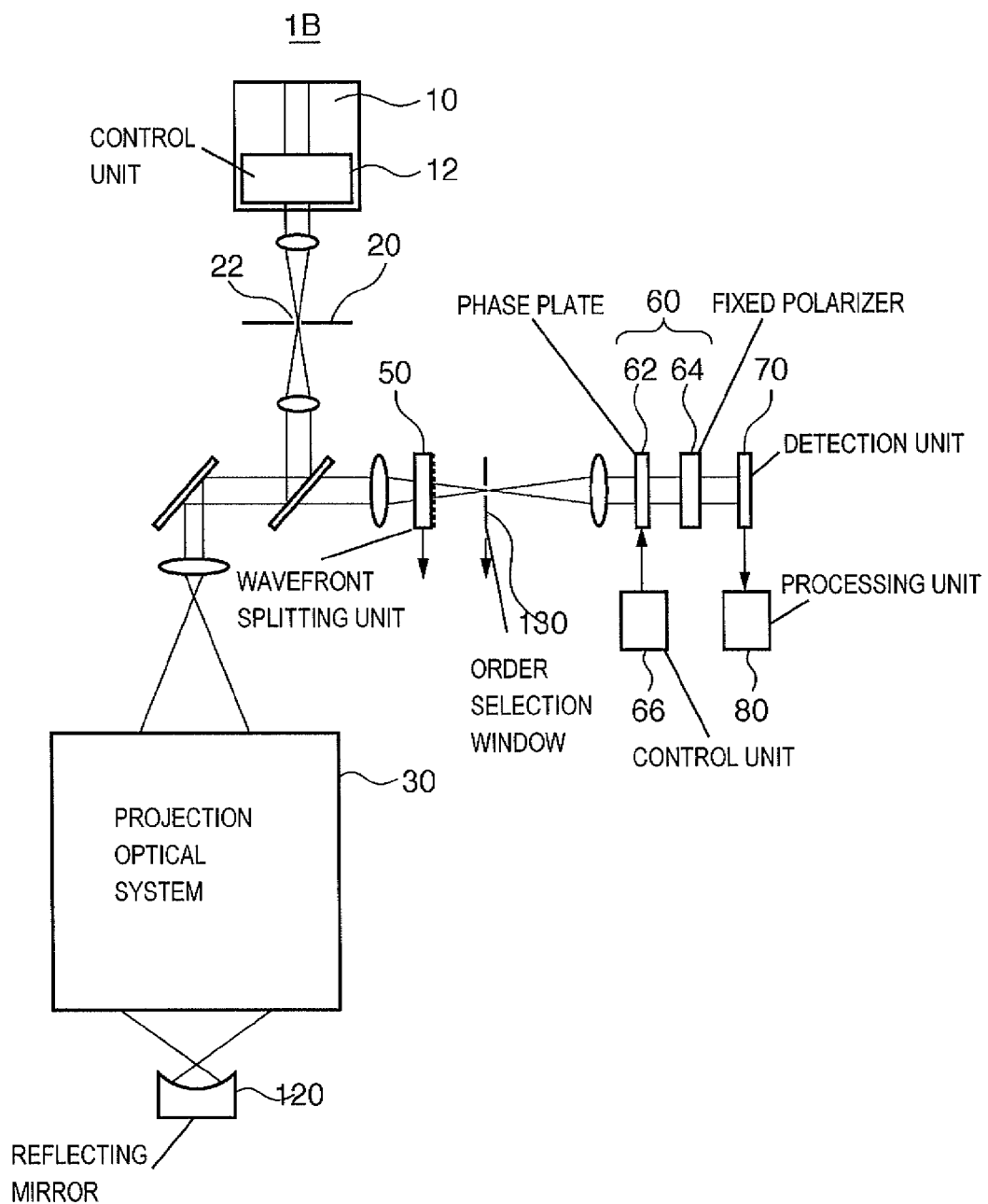
FIG. 10 is a schematic block diagram showing another exposure apparatus according to the third embodiment of the present invention.

The arrangement of the measurement apparatus of the exposure apparatus 1B according to the third embodiment is not particularly limited to that shown in FIG. 9. For example, the measurement apparatus may converge the light even on the side of the object plane of the projection optical system 30 once, as shown in FIG. 10. In this case, a diffraction grating is inserted at the preceding stage of the converging point on the side of the object plane of the projection optical system 30 as the wavefront splitting unit 50, and an order selection window 130 is inserted near the converging point.

The order selection window 130 has a function of selecting only light components of orders necessary for the measurement, of light diffracted (split) by the diffraction grating serving as the wavefront splitting unit 50. The order selection window 130 is formed by a window which extracts, for example, only the ±1st-order light components. By selectively extracting only light components of orders necessary for the measurement (for example, by extracting only the ±1st-order light components by removing the 0th-order light component and higher-order light components), the non-polarization aberration and polarization aberration of the projection optical system can be measured (calculated) with a higher accuracy. Because the order selection window 130 is unnecessary in measuring the polarized light intensity, it must be removed from the optical path in synchronism with the diffraction grating serving as the wavefront splitting unit 50 at this time. Note that FIG. 10 is a schematic block diagram showing another arrangement of the exposure apparatus 1B according to the third embodiment of the present invention.

As shown in FIG. 5, assume that a semitransparent reflecting substrate is inserted between the illumination optical system 10 and the projection optical system 30 as the wavefront splitting unit 50. Even in this case, the measurement apparatus can be constituted on the side of the object plane of the projection optical system 30 by inserting the reflecting mirror 120 on the side of the object plane of the projection optical system 30. As shown in FIG. 6, even when a one-dimensional diffraction grating 502A is inserted between the illumination optical system 10 and the projection optical system 30 as a wavefront splitting unit 50B, the reflecting mirror 120 need only be inserted on the side of the object plane of the projection optical system 30. This makes it possible to constitute the measurement apparatus on the side of the object plane of the projection optical system 30.

Fourth Embodiment

The fourth embodiment will exemplify a case in which one of the above-described measurement apparatuses is applied to the measurement of the optical characteristics (non-polarization aberration and polarization aberration) of an illumination optical system. The measurement apparatus can also be used as a sensor which confirms whether light (illumination light) which enters a projection optical system is in a desired polarization state.

Figure 11:
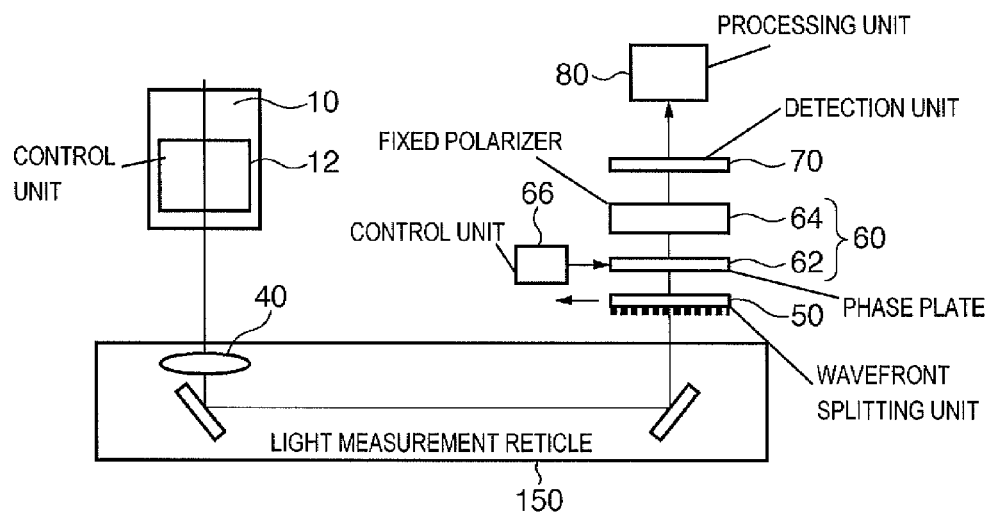
FIG. 11 is a schematic block diagram showing an illumination light measurement reticle included in a measurement apparatus which measures the optical characteristics of an illumination optical system.

As shown in FIG. 11, the measurement apparatus which measures the optical characteristics of an illumination optical system 10 includes an illumination light measurement reticle 150. In this embodiment, the illumination light measurement reticle 150 has a collimator lens 40. The measurement apparatus also includes a wavefront splitting unit 50, second polarization control unit 60, detection unit 70, and processing unit 80. As in the first embodiment, a diffraction grating is used as the wavefront splitting unit 50. The wavefront splitting unit 50 can be inserted/removed into/from the optical path. When the diffraction grating serving as the wavefront splitting unit 50 is inserted in the optical path, the interference pattern can be measured. When the diffraction grating serving as the wavefront splitting unit 50 is removed from the optical path, the polarized light intensity can be measured. Note that FIG. 11 is a schematic block diagram showing the illumination light measurement reticle 150 included in the measurement apparatus which measures the optical characteristics of the illumination optical system 10.

A general reticle has a thickness of about 6 mm, and mounts a pellicle at a position of about 6 mm from its lower surface. Accordingly, the reticle has an overall thickness of about 12 mm. When lenses and mirrors are set to fall within the range of 12 mm, the polarization state of light which enters a projection optical system 30 can be measured at the reticle position without moving the projection optical system 30.

In measuring the non-polarization aberration and polarization aberration of the illumination optical system 10 as its optical characteristics, the wavefront splitting unit 50 is inserted into the optical path first. Incident polarized light generated by a first polarization control unit 12 of the illumination optical system 10 turns into parallel light by the collimator lens 40 and mirrors included in the illumination light measurement reticle 150. The light which emerges from the illumination light measurement reticle 150 is split by the wavefront splitting unit 50, passes through the second polarization control unit 60 (phase plate 62 and polarizer 64), and is detected by the detection unit 70 as an interference pattern.

In the second polarization control unit 60, the polarizer 64 is fixed between the projection optical system 30 and the detection unit 70. The phase plate 62 is inserted between the projection optical system 30 and the detection unit 70, and can rotate about the optical axis.

The first polarization control unit 12 of the illumination optical system 10 generates light beams (incident polarized light beams) in at least two different polarization states. By rotating the phase plate 62 for the respective light beams in these two polarization states, at least four interference patterns can be obtained.

The wavefront splitting unit 50 is removed from the optical path, and the polarized light intensity is measured. More specifically, the first polarization control unit 12 of the illumination optical system 10 generates predetermined incident polarized light, rotates the phase plate 62, and detects a change in intensity. At least one polarization aberration data is calculated and set as reference birefringence.

The processing unit 80 calculates the non-polarization aberration and polarization aberration of the illumination optical system 10 as its optical characteristics based on the reference birefringence obtained from the polarized light intensity, and the differential wavefronts obtained from the interference patterns.

In this manner, the use of the illumination light measurement reticle 150 allows to measure not only the optical characteristics of the projection optical system 30 but also those of the illumination optical system 10. Assume that the optical characteristics of the illumination optical system 10 and projection optical system 30 can be measured individually. In this case, it is possible to measure the optical characteristics of the illumination optical system 10 alone by adjusting the illumination optical system 10, and to apply the optical characteristics of the illumination optical system 10 and projection optical system 30 to simulation. In other words, individually measuring the optical characteristics of the illumination optical system 10 and projection optical system 30 allows various practical applications of the measurement apparatus. It is also possible to, e.g., improve the measurement accuracy and shorten the measurement time.

The polarization state of light (illumination light) which enters the projection optical system 30 is measured by a combination of the collimator lens 40, second polarization control unit 60 (phase plate 62 and polarizer 64), and detection unit 70 without inserting the wavefront splitting unit 50 into the optical path.

The arrangement of the lens and mirrors in the illumination light measurement reticle 150 is not particularly limited to that shown in FIG. 11. For example, the collimator lens 40 may be inserted at the succeeding stage of the mirror. The polarizer 64 can be substituted by a PBS or a mirror set at the Brewster's angle. The detection unit 70 can be an alignment scope.

Fifth Embodiment

The fifth embodiment will exemplify a case in which one of the above-described measurement apparatuses is applied to the measurement of the optical characteristics (non-polarization aberration and polarization aberration) of an optical system of an apparatus other than an exposure apparatus.

Figure 12:
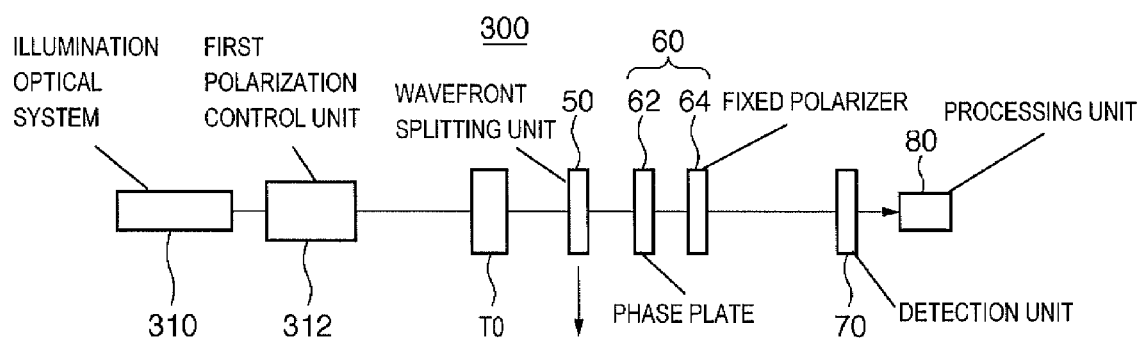
FIG. 12 is a schematic block diagram showing a measurement apparatus according to a fifth embodiment of the present invention.

FIG. 12 is a schematic block diagram showing the arrangement of a measurement apparatus 300 according to the fifth embodiment of the present invention. The measurement apparatus 300 measures the optical characteristics (non-polarization aberration and polarization aberration) of an optical system TO to be measured. As shown in FIG. 12, the measurement apparatus 300 includes an illumination optical system 310, first polarization control unit 312, wavefront splitting unit 50, second polarization control unit 60 (phase plate 62 and polarizer 64), detection unit 70, and processing unit 80. The illumination optical system 310 and first polarization control unit 312 have almost the same functions as those of the illumination optical system 10 and first polarization control unit 12, respectively.

In measuring the optical characteristics of the optical system TO to be measured, the wavefront splitting unit 50 is inserted into the optical path first. Incident polarized light generated by the first polarization control unit 312 turns into a wavefront containing the optical characteristics of the optical system TO to be measured upon passing through the optical system TO to be measured. The light which emerges from the optical system TO to be measured is split by the wavefront splitting unit 50, passes through the second polarization control unit 60 (phase plate 62 and polarizer 64), and is detected by the detection unit 70 as an interference pattern.

In the second polarization control unit 60, the polarizer 64 is fixed between the optical system TO to be measured and the detection unit 70. The phase plate 62 is inserted between the optical system TO to be measured and the detection unit 70, and can rotate about the optical axis.

The first polarization control unit 312 generates light beams (incident polarized light beams) in at least two different polarization states. By rotating the phase plate 62 for the respective light beams in these two polarization states, at least four interference patterns can be obtained.

The wavefront splitting unit 50 is removed from the optical path, and the polarized light intensity is measured. More specifically, the first polarization control unit 312 generates predetermined incident polarized light, rotates the phase plate 62, and detects a change in intensity. At least one polarization aberration data is calculated and set as reference birefringence.

The processing unit 80 calculates the non-polarization aberration and polarization aberration of the optical system TO to be measured as its optical characteristics based on the reference birefringence obtained from the polarized light intensity, and the differential wavefronts obtained from the interference patterns.

The position of the wavefront splitting unit 50 is not particularly limited to that shown in FIG. 12. The wavefront splitting unit 50 may be inserted at the succeeding stage of the second polarization control unit 60 or the preceding stage of the optical system TO to be measured.

In this manner, the measurement apparatus 300 can measure not only the optical characteristics of a projection optical system and illumination optical system of an exposure apparatus, but also those of other optical systems and optical elements (for example, a lens and diffractive optical element) with high accuracy in a short period of time.

Sixth Embodiment

A device fabrication method using an exposure apparatus 1, 1A, or 1B will be explained next. As described above, the non-polarization aberrations and polarization aberrations of an illumination optical system 10 and projection optical system 30 used for the exposure apparatus 1, 1A, or 1B are minimized, and the exposure apparatus 1, 1A, or 1B therefore exhibits an excellent exposure performance. Hence, the exposure apparatus 1, 1A, or 1B can provide devices (for example, a semiconductor device and liquid crystal device) with high throughput and a good economical efficiency. These devices are fabricated by a step of exposing a substrate (e.g., a wafer or glass plate) coated with a resist (photosensitive agent) using the exposure apparatus 1, 1A, or 1B, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-235947 filed on Sep. 11, 2007, which is hereby incorporated by reference herein in its entirety.

What is claimed is:

1. A measurement apparatus which measures optical characteristics of an optical system to be measured, comprising:
   a first polarization control unit configured to control a polarization state of light which enters the optical system to be measured to at least two different polarization states;
   an image sensor configured to measure light transmitted through the optical system to be measured;
   a wavefront splitting unit which is inserted between said first polarization control unit and the optical system to be measured or between the optical system to be measured and said image sensor, and is configured to split a wavefront of the light;
   a second polarization control unit which is inserted between the optical system to be measured and said image sensor, includes a phase plate which is rotatable about an optical axis, and is configured to control the polarization state of the light; and
   a processing unit configured to calculate a non-polarization aberration and a polarization aberration of the optical system to be measured, based on a plurality of interference patterns sequentially sensed by said image sensor by rotating the phase plate,
   wherein said wavefront splitting unit can be inserted into or removed from an optical path,
   wherein said processing unit calculates reference birefringence information based on a light intensity sensed by the image sensor when said wavefront splitting unit is not arranged in the optical path, and
   wherein said processing unit calculates the non-polarization aberration and the polarization aberration of the optical system to be measured, based on the reference birefringence information and interference patterns sensed by said image sensor when said wavefront splitting unit is arranged in the optical path.

2. The apparatus according to claim 1, wherein
   said second polarization control unit includes a polarizer, and
   said polarizer is fixed.

3. The apparatus according to claim 1, wherein
   said second polarization control unit includes a polarizer, and
   said polarizer is fixed and said phase plate is rotated so that a plurality of interference patterns for each of the light beams in said at least two polarization states are sequentially sensed by said image sensor.

4. The apparatus according to claim 3, wherein said at least two polarization states are determined based on a direction of a transmission axis of said polarizer and a phase difference and rotation angle of the phase plate.

5. The apparatus according to claim 1, wherein
   said first polarization control unit controls the polarization state of the light which enters the optical system to be measured to obtain at least two different substantially linearly polarized light beams,
   said second polarization control unit includes a polarizer, and
   polarization directions of said at least two substantially linearly polarized light beams are different from a direction of a transmission axis of said polarizer.

6. The apparatus according to claim 5, wherein the polarization directions of said at least two substantially linearly polarized light beams are different from the direction of the transmission axis of said polarizer by 45°.

7. The apparatus according to claim 5, wherein the polarization directions of said at least two substantially linearly polarized light beams are orthogonal to each other.

8. The apparatus according to claim 1, wherein
   said phase plate is rotated so that at least two interference patterns for each of the light beams in said at least two polarization states are sequentially sensed by said image sensor, and
   said processing unit calculates the optical characteristics of the optical system to be measured, based on said at least four interference patterns sensed by said image sensor.

9. An exposure apparatus comprising:
   an illumination optical system configured to illuminate a reticle with light from a light source;
   a projection optical system configured to project a pattern of the reticle onto a substrate; and
   a measurement apparatus configured to measure optical characteristics of at least one of said projection optical system and said illumination optical system as an optical system to be measured,
   wherein said measurement apparatus includes a measurement apparatus according to claim 1.

10. The apparatus according to claim 9, further comprising at least one of an illumination system control unit configured to adjust said illumination optical system, and a projection system control unit configured to adjust said projection optical system,
    wherein said illumination system control unit adjusts said illumination optical system based on the optical characteristics of said at least one of said illumination optical system and said projection optical system, which are calculated by said processing unit, and
    wherein said projection system control unit adjusts said projection optical system based on the optical characteristics of said at least one of said illumination optical system and said projection optical system, which are calculated by said processing unit.

11. A device fabrication method comprising steps of:
    exposing a substrate using an exposure apparatus according to claim 9; and
    performing a development process for the substrate exposed.

* * * * *